United States Patent [19]

Kawai et al.

[11] 4,329,665

[45] May 11, 1982

[54] NOISE SUPPRESSING CONNECTOR

[75] Inventors: Senji Kawai, Komaki; Yoshihumi Morimoto, Aichi; Masayuki Watanabe, Aichi; Hiroshi Yamaya, Aichi; Hitoshi Kurohata, Komaki; Joji Nakamura, Inazawa, all of Japan

[73] Assignee: Matsushita Electric Industrial Company, Limited, Osaka, Japan

[21] Appl. No.: 146,425

[22] Filed: May 5, 1980

[30] Foreign Application Priority Data

May 9, 1979 [JP] Japan ................................ 54-57326

[51] Int. Cl.³ ...................... H03H 7/01; H01R 13/66

[52] U.S. Cl. .................................. 333/182; 333/185; 339/147 R

[58] Field of Search .............................. 333/167-168, 333/181-185, 174-180; 339/147 R, 147 C, 143 R

[56] References Cited

U.S. PATENT DOCUMENTS

| | | | |
|---|---|---|---|
| 3,060,392 | 10/1962 | Ciancarelli | 333/182 |
| 3,076,947 | 2/1963 | Davidson, Jr. | 333/181 |
| 3,548,347 | 12/1970 | Miller et al. | 333/181 X |

*Primary Examiner*—Marvin L. Nussbaum
*Attorney, Agent, or Firm*—Lowe, King, Price & Becker

[57] ABSTRACT

A noise suppressing connector comprises a shielding casing, first and second contact pins to be connected to external circuits, and a filter including at least one capacitor and a coil wound about a core made of a ferromagnetic material. An insulative housing is enclosed by the casing, and this insulative housing has a partition defining a bore with the inner wall of the housing. The first contact pin passes through the partition to project into the bore, while the filter is disposed in the bore to be connected between the first and second contact pins. At least one conductive plate is disposed in the bore and is connected to the casing for effectively shielding the filter and for serving as a ground circuit. The space in the bore may be filled with a suitable insulative material. The number of capacitors and coils may be increased to constitute a desired filter, such as a low-pass, high-pass or band-pass filter. With this provision noises which tend to pass through the connector are blocked, while induction and radiation of interfering waves and spurious waves are effectively prevented.

22 Claims, 21 Drawing Figures

NOISE SUPPRESSING CONNECTOR

FIELD OF THE INVENTION

This invention generally relates to electrical connectors adapted to establish electrical connection between various electrical devices, such as audio devices, communication systems and various control systems. More particularly, the present invention relates to an electrical connector having a filter means for effectively suppressing noises.

BACKGROUND OF THE INVENTION

When electrical connection is established by means of a conventional connector, means for preventing interfering waves from entering a signal to be transmitted or for removing spurious signals has to be employed independently of the connector. Namely, a plurality of capacitors each having a through-hole therein, are connected to corresponding conductors extending from such a conventional connector as will be described in detail with reference to drawings. The combination of such a conventional connector and the above mentioned capacitors requires a relatively large space, while being time consuming to install the capacitors and to solder the terminals of the capacitors with the conductors of the connector. Furthermore, the suppression or elimination of noises cannot be sufficiently achieved with such a combination.

SUMMARY OF THE INVENTION

The present invention has been developed in order to remove the above mentioned drawbacks and disadvantages inherent to conventional connectors.

It is, therefore, a primary object of the present invention to provide a new and useful noise suppressing connector which effectively prevents incoming interfering signals or waves from entering an electrical device, and prevents noises which occur in the device from radiating outwardly.

Another object of the present invention is to provide such a connector having a filter means incorporated therein so that the combination of the connector and the filter means occupies a relatively small space.

According to the present invention there is provided a noise suppressing connector having at least one section which establishes a single connection, said section comprising: (a) an insulative housing having a partition therein, said housing having at least one bore defined by the inner wall of said housing and said partition; (b) a shielding casing for receiving said housing; (c) a first conductive contact pin embedded in said partition, said first contact pin extending outwardly from said partition in both directions substantially perpendicular to said partition so that one end of said first contact pin projects into said bore; (d) a second conductive contact pin extending outwardly from said bore; (e) a filter including at least a capacitor and at least a coil, said filter being received in said bore, and said filter being electrically interposed between said first and second contact pins so that said first and second contact pins and said filter constitute a signal transmission line; (f) a conductive plate having a through-hole therein, said conductive plate being disposed in said bore in such a manner that a portion of said signal transmission line passes through said through-hole; and (g) an insulative filling filled in the space in said bore.

BRIEF DESCRIPTION OF THE DRAWINGS

These and other objects and features of the present invention will become more readily apparent from the following detailed description of the preferred embodiments taken in conjunction with the accompanying drawings in which:

FIGS. 8 and 9 show low-pass filters, FIG. 10 shows a band-pass filter, FIGS. 11 and 12 show high-pass filters, and FIG. 13 shows a band-pass filter;

DETAILED DESCRIPTION OF THE PREFERRED EMBODIMENTS

Figure 1:
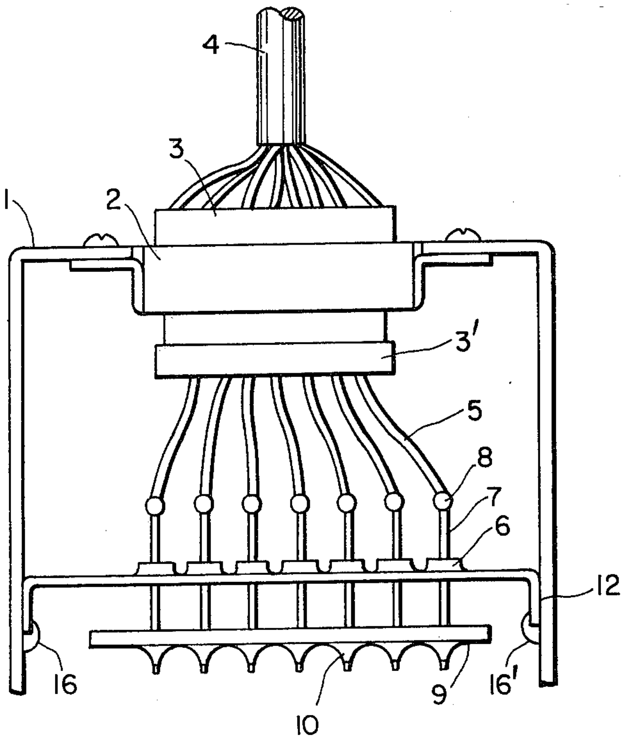
FIG. 1 PRIOR ART
FIG. 1 is a schematic front view of a conventional connector shown to be connected to a plurality of capacitors.

Prior to describing the embodiments of the present invention, a conventional connector will be described hereinbelow for a better understanding of the objects of the present invention. FIG. 1 illustrates a schematic front view of a conventional electrical connector and peripheral elements used with the connector. In FIG. 1, a reference numeral 1 designates a casing or chassis of an electrical device to be electrically connected to another device. A numeral 2 designates a male connector fixedly disposed in an opening made in the casing 1, and this male connector 2 has a plurality of contact pins (not shown). A female connector 3 is connected to the top of male connector 2, while another female connector 3' is connected to the bottom of male connector 2. Each of female connectors 3, 3' has a plurality of contact members (not shown) which are arranged to be in contact with corresponding contact pins of the male connector 2. The first female connector 3 is connected to a cable 4 including a plurality of wires which establish the connection between electrical devices, while a plurality of wires or conductors 5 is connected to corresponding contact members of the second female connector 3′. A reference numeral 6 designates a plurality of feedthrough capacitors, and the above mentioned conductors 5 are respectively connected to inner conductors 7 of the feedthrough capacitors 6 by means of solder 8. The other ends of the inner conductors 7 are respectively connected to terminals of a printed circuit board 9 by means of solder 10. Outer electrodes 11 of feedthrough capacitors 6 are connected by means of solder 15 to a conductive plate 12 which is connected to the casing 1 with solder 16 and 16′.

Figure 2:
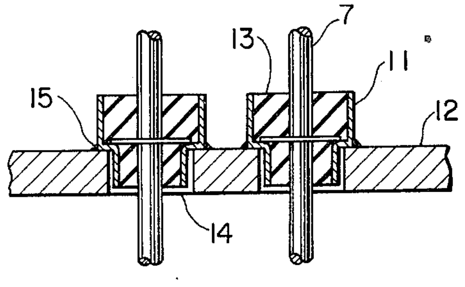
FIG. 2 PRIOR ART
FIG. 2 is an enlarged cross-sectional view of the capacitors shown in FIG. 1.

FIG. 2 is an enlarged cross-sectional view of the feedthrough capacitors 6 shown in FIG. 1. A plurality of through-holes 14 is made in the conductive plate 12, and the outer electrodes of the feedthrough capacitors 6 are respectively received by the through-holes 14, while each of the inner conductors 7 is insulated from each other without coming into contact with the inner wall of each through-hole 14.

In the conventional connectors shown in FIGS. 1 and 2, a capacitor block including the feedthrough capacitors 6 and conductive plate 12 is interposed between the connector assembly 2, 3 and 3′ and the printed circuit board 9 in order to prevent interfering waves from entering the signal to be transmitted and to prevent spurious signals from radiating outwardly. Namely, the capacitor block had to be employed independently of the connector assembly 2, 3 and 3′. Furthermore, with this conventional provision the elimination of noise cannot be satisfactorily achieved.

Figure 3A:
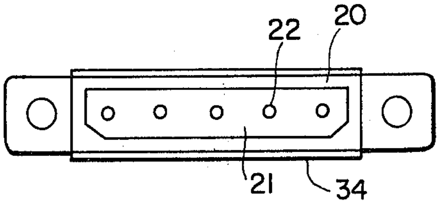
FIGS. 3(A), 3(B), and 3(C) respectively include a top view, a front view and a side view of a noise suppressing connector according to the present invention.
Figure 3B:
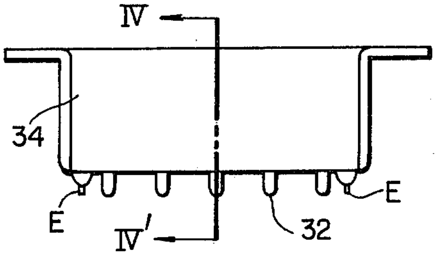
Figure 3C:
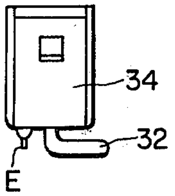

Reference is now made to FIG. 3 which shows a top view (A), a front view (B) and a side view (C) of an embodiment of the electrical connector according to the present invention. As shown in FIG. 3 the connector is a male connector so that suitable female connectors may be attached to this male connector when used. If desired, however, contact pins at one side may be directly connected to terminals of an electrical device. The male connector according to the present invention will be simply referred to as a connector hereinbelow for simplicity. The connector comprises a casing 34 which functions as a shielding means and a supporting means. Namely, the casing 34 is made of a metal and has holes (no numeral) so that the connector will be easily attached to a casing or chassis of an electrical device.

An insulative housing 20 is disposed in the casing 34 and a plurality of contact pins 22 is supported by the housing 20. Although the illustrated connector is a 5-pin connector, the number of connecting circuits may be changed at will. These contact pins 22 are mounted at the upper portion of the connector, and at the lower portion thereof are mounted other contact pins 32. In addition, ground terminals E are mounted at the bottom of casing 34.

Figure 4:
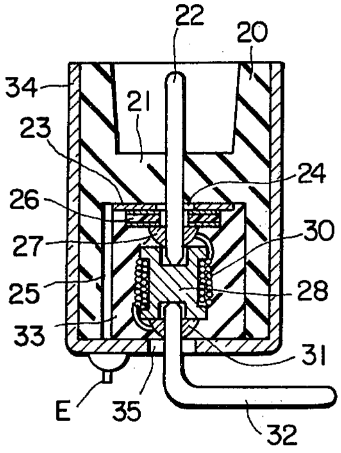
FIG. 4 is a cross-sectional view of the connector of FIG. 3 taken along the line IV-IV'.
Figure 5:
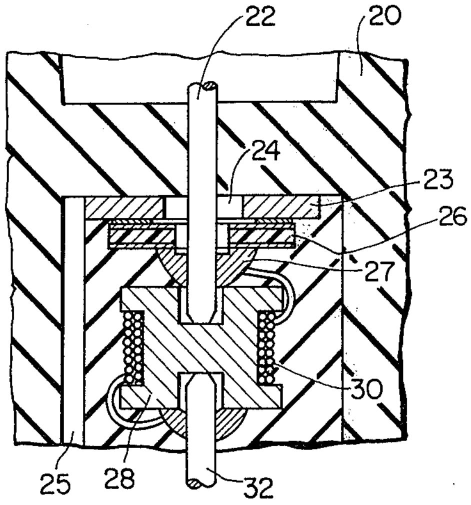
FIG. 5 is an enlarged view of FIG. 4.

The detailed construction of the connector will be best seen in a cross-sectional view illustrated in FIG. 4 and an enlarged cross-sectional view of FIG. 5 both taken along the line IV-IV′ of FIG. 3(B). Since each connecting circuit in the connector has the same construction, one connecting circuit will be described. The insulative housing 20 is hollow cylindrical and has a partition 21 therein. The partition 21 is integrally formed with housing 20 and is substantially perpendicular to the outer surface of the housing. The partition 21 is disposed about midway between the top and the bottom of housing 20 so that the cross-section of the housing 20 is substantially H-shaped. In other words, first and second recesses or bores (no numeral) are defined by the inner wall of the housing 20 and the partition 21. The above-mentioned contact pin 22 is embedded in a through-hole made in the center of the partition 21 and this contact pin 22 extends outwardly from the partition in both directions, i.e. upwardly and downwardly in the drawing, substantially perpendicular to the partition 21.

An annular conductive plate 23 is attached to the bottom of the partition 21, while the annular conductive plate 23 is connected via a conductive plate or strip 25 to the ground terminal E. The conductive strip 25 extends downwardly from the end portion of the annular plate 23 to ground terminal E along the inner wall of the second bore of the housing 20. The ground terminal E is common to all of the connecting circuits shown in FIG. 3. The annular plate 23 and the strip 25 may be integrally formed. An annular or ring-shaped capacitor 26, which is made by sandwiching an annular dielectric plate between a pair of annular thin electrodes, is placed on the bottom of the annular plate 23. The top or upper thin electrode or plate (no numeral) of the capacitor 26 is electrically connected to the annular plate 23, which is connected to the ground terminal E via the strip 25, by means of solder. The bottom or lower plate (no numeral) of the capacitor 26 is electrically connected to the contact pin 22 by means of solder 27, which contact pin 22 is arranged to pass through the through-holes or openings 24 of the annular conductive plate 23 and the annular capacitor 26.

An axial core 28 is disposed below the capacitor 26, and this axial core 28 is made of a ferromagnetic material. A coil 30 is wound about the axial core 28, and a first lead wire of the coil 30 is connected to the contact pin 22 by means of the above-mentioned solder 27. A second lead wire of the coil 30 is connected to the contact pin 32 by means of solder 31. The axial core 28 has a U-shaped recess at each of the top and bottom thereof, and the top recess receives the lower end of the first contact pin 22, while the bottom recess receives the upper end of the second contact pin 32. The second contact pin 32 extends outwardly from the casing 34 through an opening 35 made at the bottom of the casing 34. Although the second contact pin 32 is L-shaped in the drawings, the shape of the second contact pin 32 may be changed if desired. The space in the second bore is filled with a suitable insulative material 33, such as a synthetic resin, so that various elements disposed in the second bore are fixedly supported. The first contact pin 22 is entirely received in the first bore, while the second contact pin 32 projects outwardly from the shielding casing 34. This means that the first contact pin 22 will be connected to a female connector (not illustrated) whose contact portion will be inserted in the first bore when making connection, and the second contact pin 32 will be connected either to a female connector (not illustrated) or directly to a terminal of an electrical device.

Figure 6A:
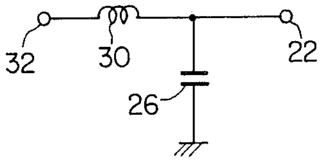
FIG. 6(A) is an equivalent circuit diagram of the connector shown in FIG. 4.

If the second contact pin 32 is used as an input terminal, while the first contact pin 22 is used as an output terminal, the equivalent circuit of the connector of FIG. 4 and FIG. 5 will be shown by FIG. 6(A). Namely, the coil 30 is interposed between the input and output terminals 32 and 22, and the capacitor 26 is connected between the output terminal 22 and ground which corresponds to the ground terminal E.

Figure 6B:
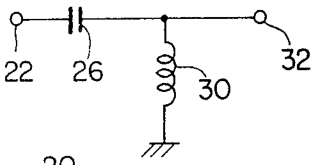
FIG. 6(B) is an equivalent circuit diagram of a connector which will be obtained by changing the connection in the connector shown in FIG. 4.

On the other hand if the first contact pin 22 is used as an input terminal and the second contact pin 32 is used as an output terminal, wherein connection of the capacitor 26 and the coil 30 is changed in a proper manner, a circuit arrangement whose equivalent circuit is shown by FIG. 6(B) will be readily obtained. In order to provide such a circuit arrangement of FIG. 6(B) the lower end of the first contact pin 22 is connected to the top annular plate of the capacitor 26, while the bottom annular plate of the capacitor 26 is connected to the first lead wire of the coil 30. The second lead wire of the coil 30 is connected to the annular conductive plate 23 which is connected to the ground terminal E. The second contact pin 32 extends upwardly so that it passes through a cylindrical bore made at the center of the axial core 28 to reach the bottom annular plate of the capacitor 26 for electrical connection thereto. With this arrangement the capacitor 26 will be interposed between the input and output terminals 22 and 32, while the coil 30 is connected between the output terminal 32 and ground. This arrangement is similar to that of FIG. 18, discussed infra.

Figure 7:
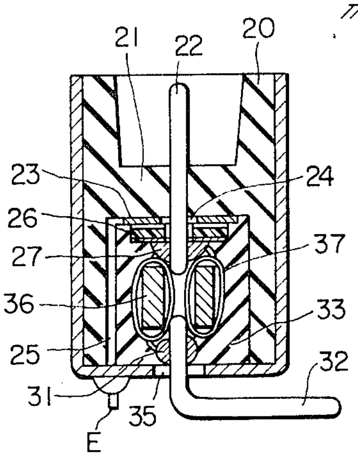
FIG. 7 is a cross-sectional view of another embodiment of the connector according to the present invention.

Reference is now made to FIG. 7 which shows a second embodiment of the connector according to the present invention. The second embodiment is the same as the first embodiment in construction except that the coil assembly is replaced with a toroidal coil 37 wound about a toroidal core 36 which is made of a ferromagnetic material.

In the above described embodiments, a single coil 30 or 37 and a single capacitor 26 are employed for constituting a filter, such as a low-pass filter of FIGS. 4, 5, 6(A) and 7 or a high-pass filter of FIG. 6(B). However, the number of capacitors and coils may be increased if desired to form a further complex filter.

Figure 8:
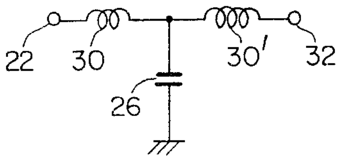
FIGS. 8 to 13 are equivalent circuit diagrams of connectors which may be obtained by employing a given number of capacitors and coils according to the present invention.
Figure 11:
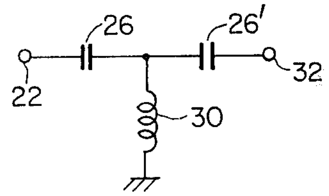
Figure 9:
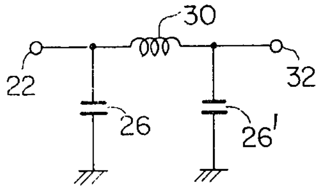
Figure 12:
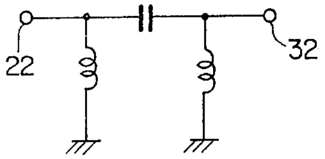
Figure 10:
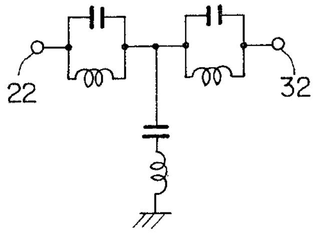
Figure 13:
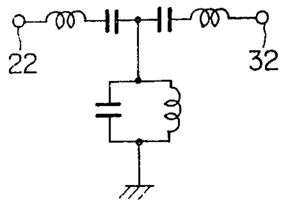

FIG. 8 to FIG. 13 illustrate equivalent circuits of connectors which can be readily constructed by using a necessary number of coils and capacitors. FIGS. 8 and 9 are low-pass filters, FIGS. 11 and 12 are high-pass filters, and FIGS. 10 and 13 are band-pass filters. Some of these filters will be further described below by way of drawings showing the detailed construction thereof hereinlater.

Figure 14:
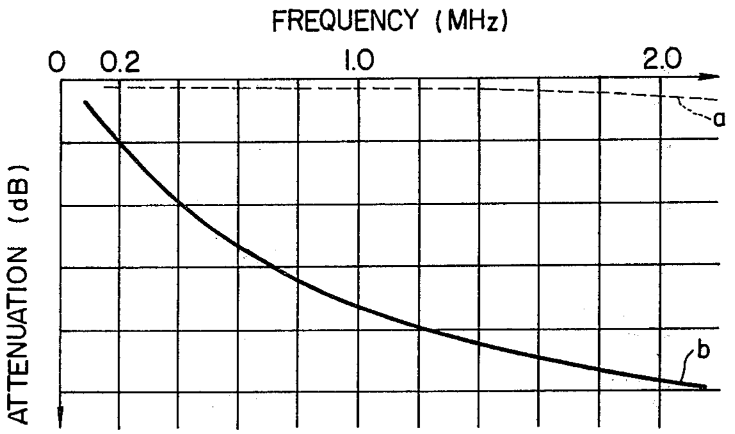
FIGS. 14 and 15 are graphical representations of the attenuating characteristics obtained by a conventional system and by the present invention.
Figure 15:
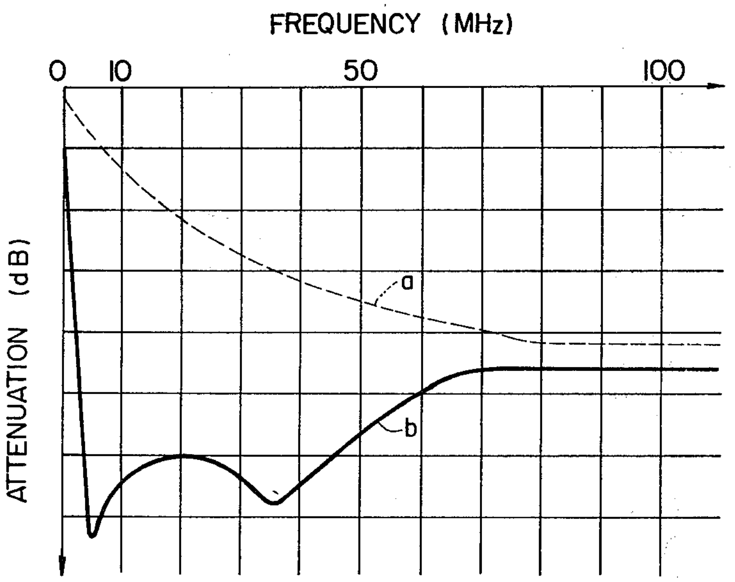

FIGS. 14 and 15 show attenuating characteristics obtained respectively by the conventional connecting means and the connector according to the present invention, shown in FIGS. 3 to 5. Dotted lines a in FIGS. 14 and 15 indicate the attenuating characteristic obtained when the combination of the conventional connector and a capacitor is used as shown in FIGS. 1 and 2, while solid lines b in these drawings indicate that obtained by the connector of FIGS. 3 to 5. FIG. 14 shows a partially enlarged view of the graph of FIG. 15. As will be recognized from these graphical representations the attenuating characteristic b obtained by the present invention is remarkably superior than that according to the conventional technique between 0.2 and 70 MHz. In addition, the attenuating characteristic according to the present invention above 70 MHz is somewhat similar to that in conventional technique. The characteristics represented by FIGS. 14 and 15 are of only the filters respectively connected to the connector in the conventional technique and built in the casing of the connector according to the present invention. Namely, these characteristics of FIGS. 14 and 15 do not include characteristics as to possible incoming interfering signals or spurious signals which tend to be radiated externally. Generally speaking, a coil wound about a core made of a ferromagnetic material is apt to function as an antenna so that such a coil induces or picks up interfering waves, while such a coil also radiates spurious signals. Namely, if the coil 30 of FIG. 4 were not installed in the shielding casing 34, the coil 30 would function as an antenna so that the induction and radiation of interfering waves apt to occur more easily than in conventional connecting apparatus resulting in the induction of interfering waves into an electrical device and/or the radiation of spurious waves from the device although a superior filtering characteristic as shown in FIG. 14 and FIG. 15 is obtained by winding a coil about a ferromagnetic core for attaining high inductance. However, according to the present invention the coil 30 is shielded by the shielding casing 34 and the conductive annular plate 23 so that the coil 30 is prevented from functioning as an antenna. Accordingly, the above mentioned undesirable problems would not occur when the connector according to the present invention is used, while a high attenuating characteristic is obtained.

Figure 16:
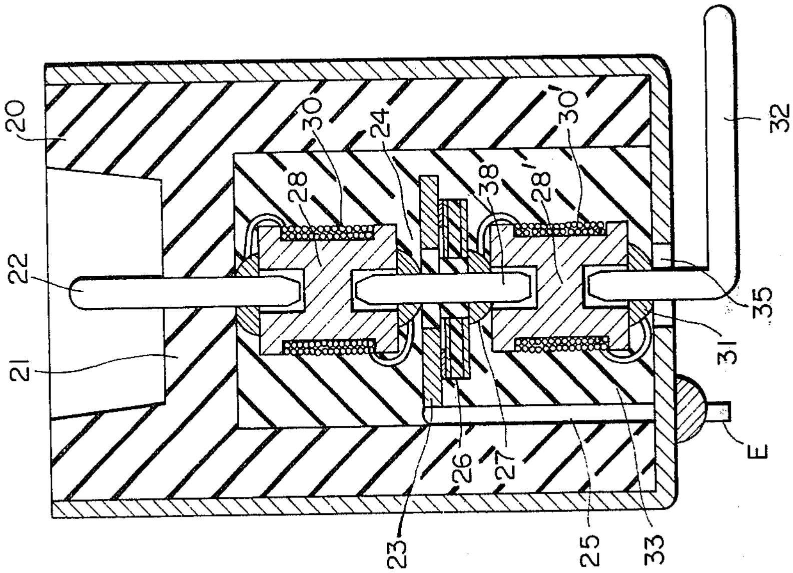
FIG. 16 is a schematic cross-sectional view of another embodiment of the connector, the equivalent circuit diagram of which is shown in FIG. 8, according to the present invention.

FIG. 16 illustrates another embodiment of the connector according to the present invention. This connector comprises first and second coils 30 and 30' and a single capacitor 26 as elements which constitute a filter. These coils 30 and 30' are respectively wound about axial cores 28 and 28', and the coils 30 and 30' are connected in series by means of a conductive pin 38. This conductive pin 38 is connected to one terminal of a capacitor 26 having another terminal connected to ground. The series circuit of the coils 30 and 30' is interposed between first and second contact pins 22 and 32, which function as input and output terminals or vice versa, so that the arrangement of FIG. 16 corresponds to the equivalent circuit of FIG. 8.

The arrangement of FIG. 16 is similar to that of FIG. 4, and therefore the same elements are designated by like numerals. The connector of FIG. 16 has the first and second contact pins 22 and 32 in the same manner as in the connector of FIG. 4, but the construction of the filter between the first and second pins 22 and 32 is different from that of FIG. 4. In detail, the lower end of the first contact pin 2 is inserted in an upper recess made at the top of the first axial core 28, and this first contact pin 22 is electrically connected by means of solder to the first lead wire of the first core 28. A second lead wire of the first coil 30 is connected by means of solder to the above-mentioned conductive pin 38, the upper portion of which is inserted in a lower recess made at the bottom of the first axial core 28. This conductive pin 38 extends downwardly and passes through openings formed in annular conductive plate 23 and annular capacitor 26 disposed on the lower portion of the conductive plate 23. The conductive plate 23 is connected to the ground terminal E via a conductive strip 25, and is further connected to the upper conductive thin plate of the capacitor 26. The lower conductive thin plate of the capacitor 26 is electrically connected to the conductive pin 38 by means of solder and is further connected to a first lead wire of the second coil 30'. The lower end of the conductive pin 38 is inserted in an upper recess made at the top of the second axial core 28', while the upper end of the second contact pin 32 is inserted in a lower recess made at the bottom of the second axial core 28'. The second coil 30' has a second lead wire connected to the second contact pin 32.

Figure 17:
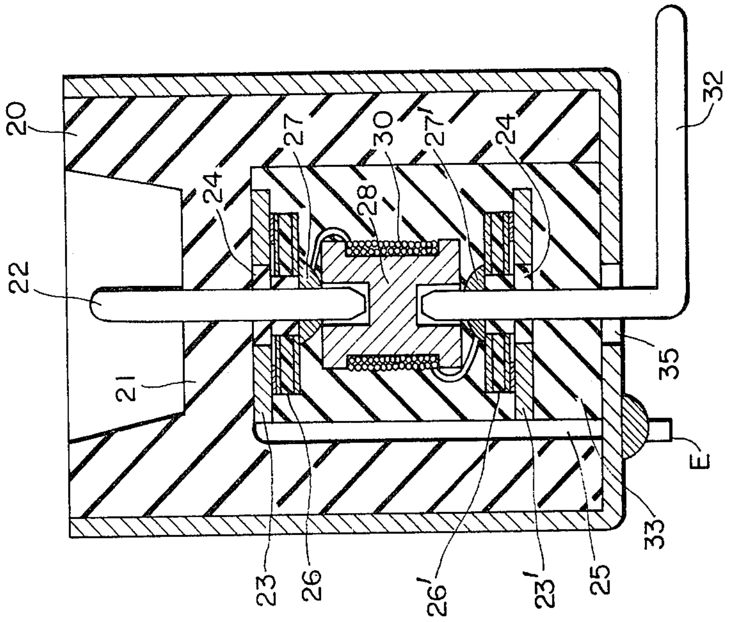
FIG. 17 is a schematic cross-sectional view of another embodiment of the connector, the equivalent circuit diagram of which is shown in FIG. 9, according to the present invention.

FIG. 17 illustrates a detailed construction of a connector the equivalent circuit of which is represented by FIG. 9. The arrangement of FIG. 17 is the same as that of FIG. 4 except that a second capacitor 26' and a second annular conductive plate 23' are additionally provided. Each of second conductive plate 23' and the second capacitor 26' has a through-hole through which the second contact pin 32 passes. The second lead wire of the coil 30 is connected to the second contact pin 32 in the same manner as in the arrangement of FIG. 4, and is further connected to the upper conductive thin plate of the second capacitor 26'. The lower conductive thin plate of the second capacitor 26' is connected to the second conductive plate 23' which is connected to the conductive strip 25 coupled to the ground terminal E.

In the above described embodiments, one or more capacitors are connected in parallel to the signal transmission line as will be seen in FIG. 6(A), FIG. 8 and FIG. (9), while one or more coils are connected in series with the transmission line. However, if desired, one or more capacitors may be connected in series with the signal transmission line while one or more coils may be connected in parallel to the transmission line as described below.

Figure 18:
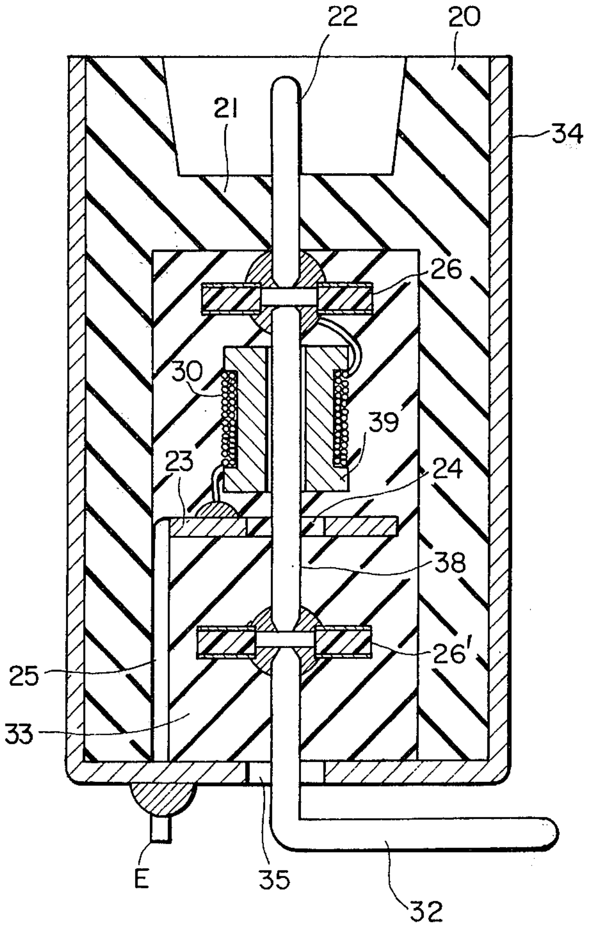
FIG. 18 is a schematic cross-sectional view of another embodiment of the connector, the equivalent circuit diagram of which is shown in FIG. 11, according to the present invention.

Reference is now made to FIG. 18 which shows a detailed construction of a connector the equivalent circuit of which is shown in FIG. 11. The connector of FIG. 18 comprises first and second capacitors 26 and 26', a coil 30 wound about an axial core 39, an annular conductive plate 23, and a conductive pin 38 all disposed in the second bore of the insulative housing 20. The arrangement except for the construction in the second bore is the same as that of previous embodiments. The lower end of the first contact pin 22 is connected to an upper conductive thin plate of the first capacitor 26, while the first contact pin 22 does not pass through the through-hole made in the first capacitor 26. The lower conductive thin plate of the first capacitor 26 is connected to an upper end of the conductive pin 38 and to a first lead wire of the coil 30. The axial core 39 of the coil 30 has a through-hole at the center thereof so that the conductive pin 38 extends through the through-hole. A second lead wire of the coil 30 is connected to the annular conductive plate 23 coupled to the ground terminal E via a conductive strip 25. The conductive pin 38 extends through the through-hole of the annular conductive plate 23 to reach the second capacitor 26'. Namely, the lower end of the conductive pin 38 is connected by means of solder to the upper conductive thin plate of the second capacitor 26'. The conductive pin 38 terminates at the upper portion of the second capacitor 26' so that it does not pass through the through-hole of the second capacitor 26' The lower conductive thin plate of the second capacitor 26' is connected to the upper end of the second contact pin 32. It will be understood from the above that the conductive pin 38 is not connected directly to either the first or second contact pin 22 or 32 so that the first and second capacitors 26 and 26' are respectively connected in series with the signal transmission line, while the coil 30 is interposed between the junction connecting these capacitors 26 and 26', and ground. The space in the second bore is filled with an insulative material in the same manner as in the previous embodiments.

From the foregoing, it will be understood that according to the present invention a filter including at least one coil and at least one capacitor is built in a connector which is shielded by a casing. Furthermore at least one conductive plate, which is electrically connected to the casing, is provided for further shielding an element or elements of the filter. The above described embodiments of the connector according to the present invention are just examples and therefore, many modifications and variations may be made without departing from the spirit of the present invention.

What is claimed is:

1. A noise suppressing connector having at least one section which establishes a signal connection, said section comprising:

(a) an insulative housing having a partition therein, said housing having at least one bore defined by the inner wall of said housing and said partition;

(b) a shielding casing for receiving said housing;

(c) a first conductive contact pin embedded in said partition, said first contact pin extending outwardly from said partition in both directions substantially perpendicular to said partition so that one end of said first contact pin projects into said bore;

(d) a second conductive contact pin extending outwardly from said bore;

(e) a filter including at least a capacitor and a coil, said filter being received in said bore, and said filter being electrically interposed between said first and second contact pins so that said first and second contact pins and said filter constitute a signal transmission line;

(f) a conductive plate having a through-hole therein, said conductive plate being disposed in said bore to enable a portion of said signal transmission line to pass through said through-hole; and (g) an insulative filling disposed in said bore.

2. A noise suppressing connector as claimed in claim 1, wherein said conductive plate is electrically connected to said casing.

3. A noise suppressing connector as claimed in claim 2, further comprising a conductive strip disposed in said bore, said conductive strip being connected between said conductive plate and said casing.

4. A noise suppressing connector as claimed in claim 3, further comprising a ground terminal connected to said casing and to said conductive strip.

5. A noise suppressing connector as claimed in claim 4, wherein said conductive strip is integrally formed with said conductive plate.

6. A noise suppressing connector as claimed in claim 1, wherein said capacitor is constructed of a dielectric plate sandwiched by a pair of conductive thin plates.

7. A noise suppressing connector as claimed in claim 6, wherein a through-hole is made in said capacitor.

8. A noise suppressing connector as claimed in claim 7, wherein one of said first and second contact pins is arranged to pass through said through-hole made in said capacitor.

9. A noise suppressing connector as claimed in claim 1, wherein one terminal of said capacitor is connected to said conductive plate.

10. A noise suppressing connector as claimed in claim 1, wherein one terminal of said coil is connected to said conductive plate.

11. A noise suppressing connector as claimed in claim 1, wherein said coil is wound about an axial core made of a ferromagnetic material.

12. A noise suppressing connector as claimed in claim 11, wherein said core has at least one recess for receiving one end of said first or second contact pin.

13. A noise suppressing connector as claimed in claim 12, wherein said recess is substantially U-shaped.

14. A noise suppressing connector as claimed in claim 11, wherein said core has a first recess at the top center of said core, and a second recess at the bottom center of said core.

15. A noise suppressing connector as claimed in claim 1, wherein said coil comprises a toroidal coil wound about a toroidal core which is made of a ferromagnetic material.

16. A noise suppressing connector as claimed in claim 15, wherein at least one of said first and second contact pins is received in the opening of said toroidal core.

17. A noise suppressing connector as claimed in claim 11, wherein said axial core has a through-hole.

18. A noise suppressing connector as claimed in claim 7, wherein said conductive plate is disposed on the lower surface of said partition in said bore, one of said conductive thin plates of said capacitor being connected to said conductive plate, said first contact pin extending to pass through the through-holes of said conductive plate and said capacitor, said first contact pin having a lower end received in an upper recess made in a core of said coil, one lead wire of said coil being connected to said lower end of said first contact pin, said core having another recess at the bottom thereof for receiving an upper end of said second contact pin, said second contact pin being connected to the other lead wire of said coil, and said conductive plate being connected to said casing.

19. A noise suppressing connector as claimed in claim 7, wherein said filter comprises first and second coils wound about first and second axial cores, as well as said capacitor, and a conductive pin arranged to pass through said through-holes of said conductive plate and said capacitor, said conductive plate being integrally formed with a conductive strip connected to said casing, one of said conductive thin plates of said capacitor being connected to said conductive plate, each of said first and second axial cores having first and second recesses, the lower end of said first contact pin being received in said first recess of said first core, the upper end of said conductive pin being received in said second recess of said first core, the lower end of said conductive pin being received in said first recess of said second core, the upper end of said second contact pin being received in said second recess of said second core, each of said first and second coils having first and second lead wires, said first lead wire of said first coil being connected to said first contact pin, said second lead wire of said first coil being connected to said conductive pin which is connected to said first lead wire of said second coil and to the other conductive thin plate of said capacitor, said second contact pin being connected to said second lead wire of said second coil so that said first and second coils and said capacitor constitute a low-pass filter.

20. A noise suppressing connector as claimed in claim 7, wherein said filter comprises first and second capacitors, as well as said coil wound about an axial core, said first capacitor being placed on the lower surface of said conductive plate, said second capacitor being placed on the upper surface of a second conductive plate having a through-hole therein, said second conductive plate being electrically connected to said first mentioned conductive plate, said first and second conductive plates being integrally formed with a conductive strip connected to said casing, one of said conductive thin plates of said first capacitor being connected to said first conductive plate, one of said conductive thin plates of said second capacitor being connected to said second conductive plate, said core having first and second recesses for respectively receiving the lower end of said first contact pin and the upper end of said second contact pin therein, said first contact pin extending through the through-holes of said first conductive plate and said first capacitor, said second contact pin extending through the through-holes of said second conductive plate and said second capacitor, the lower conductive thin plate of said first capacitor being connected to said first contact pin and to a first lead wire of said coil, the upper conductive thin plate of said second capacitor being connected to said second contact pin and to a second lead wire of said coil so that said first and second capacitors and said coil constitute a low-pass filter.

21. A noise suppressing connector as claimed in claim 20, wherein said first and second conductive plates being arranged in substantially parallel relation to each other, said first conductive plate being placed on the lower surface of said partition, said first capacitor being placed on the lower surface of said first conductive plate, and said second capacitor being placed on the upper surface of said second conductive plate.

22. A noise suppressing connector as claimed in claim 7, wherein said filter comprises first and second capacitors, as well as said coil wound about an axial core having a through-hole therein, and a conductive pin arranged to pass through said through-hole of said core, the lower end of said first contact pin being connected to the upper conductive thin plate of said first capacitor whose lower conductive thin plate is connected to a first lead wire of said coil, said conductive plate being integrally formed with a conductive strip connected to said casing and being connected to a second lead wire of said coil, said conductive pin extending from said lower conductive thin plate of said first capacitor to the upper conductive thin plate of said second capacitor through said through-hole of said conductive plate, the lower conductive thin plate of said second capacitor being connected to said second contact pin so that said first and second capacitors and said coil constitute a band-pass filter.

* * * * *